United States Patent [19]
Shiga et al.

[11] Patent Number: 5,296,456
[45] Date of Patent: Mar. 22, 1994

[54] CERAMIC SUPERCONDUCTOR WIRE AND METHOD OF MANUFACTURING THE SAME

[75] Inventors: Shoji Shiga; Naoki Uno; Hiroyuki Kikuchi, all of Tokyo, Japan

[73] Assignee: Furukawa Electric Co., Ltd., Tokyo, Japan

[21] Appl. No.: 562,205

[22] Filed: Aug. 3, 1990

[30] Foreign Application Priority Data

Aug. 9, 1989 [JP] Japan .................................. 1-206291
Sep. 18, 1989 [JP] Japan .................................. 1-241148

[51] Int. Cl.⁵ .......................................... H01L 39/12
[52] U.S. Cl. ......................................... 505/1; 428/632; 428/672; 428/673; 428/930; 505/701; 505/704
[58] Field of Search ............... 428/632, 673, 674, 930; 505/701, 704

[56] References Cited

U.S. PATENT DOCUMENTS

| | | | |
|---|---|---|---|
| 4,977,039 | 12/1990 | Onishi et al. | 428/930 |
| 4,982,497 | 1/1991 | Mier | 428/930 |
| 4,983,576 | 1/1991 | Hagino et al. | 505/704 |
| 4,990,492 | 2/1991 | Creedon et al. | 505/704 |
| 5,019,551 | 5/1991 | Hidaka | 428/930 |
| 5,093,311 | 3/1992 | Shiota et al. | 428/930 |
| 5,102,865 | 4/1992 | Woolf et al. | 428/930 |
| 5,132,278 | 7/1992 | Stevens et al. | 428/632 |
| 5,176,950 | 1/1993 | Gruen et al. | 428/930 |

FOREIGN PATENT DOCUMENTS

| | | | |
|---|---|---|---|
| 0358779 | 3/1990 | European Pat. Off. | |
| 0357480 | 3/1990 | France | 505/704 |
| 1-006310 | 1/1989 | Japan | 505/704 |
| 1-163908 | 6/1989 | Japan | 505/704 |

OTHER PUBLICATIONS

Gijs., M., et al., "Superconducting Proximity Effective Structures", Solid State Communications, vol. 71, No. 7, pp. 575-577, Jun. 1989 (505/701).

Primary Examiner—George Wyszomierski
Attorney, Agent, or Firm—Frishauf, Holtz, Goodman & Woodward

[57] ABSTRACT

Disclosed herein is a ceramic superconductor comprising a ceramic superconductive member, and a high-conductivity metal layer covering the ceramic superconductive member. At least one portion of the metal layer having low electrical conductivity or low thermal conductivity. Also disclosed is a method of manufacturing a ceramic superconductor, comprising the steps of filling a ceramic superconductor or a precursor thereof in a high-conductivity metal pipe, thereby forming a composite member, rolling the composite member into a ceramic superconductor element of a desired shape, which comprises a ceramic superconductive member and a high-conductivity metal layer covering the ceramic superconductive member, performing a predetermined heat treatment on the ceramic superconductor element, and alloying a predetermined portion of the high-conductivity metal layer, thereby rendering the portion less conductive either electrically or thermally.

10 Claims, 3 Drawing Sheets

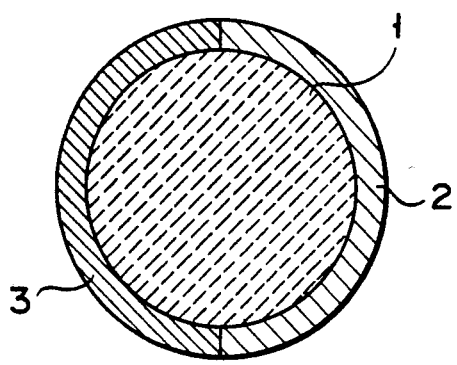
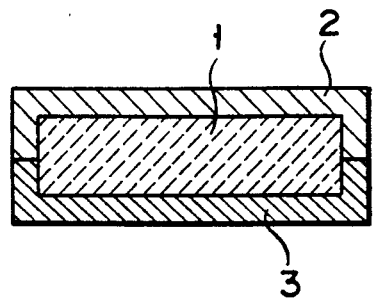
FIG. 1    FIG. 2
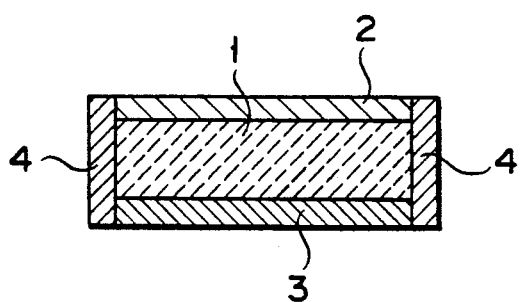
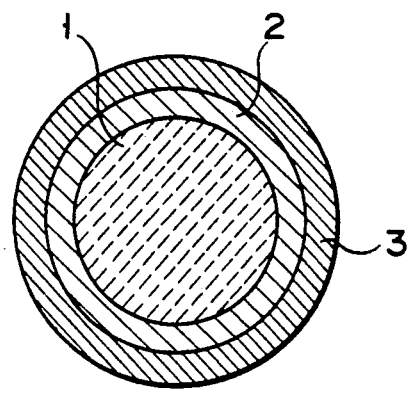
FIG. 3    FIG. 4
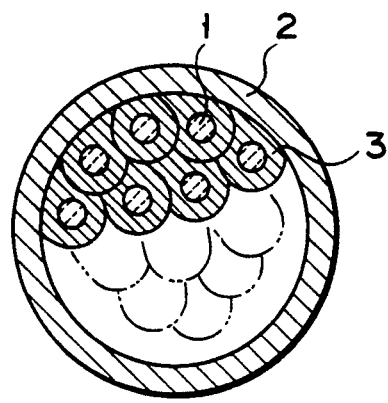
FIG. 5

CERAMIC SUPERCONDUCTOR WIRE AND METHOD OF MANUFACTURING THE SAME

BACKGROUND OF THE INVENTION

1. Field of the Invention

The present invention relates to a ceramic superconductor wire used as an electric wire, a cable, a coil winding, an electromagnetic shielding body, and a current lead wire for supplying a current to a superconductor element and a method of manufacturing the ceramic superconductor wire and, more particularly, a ceramic superconductor wire having a small AC current loss and a method of manufacturing the ceramic superconductor wire.

2. Description of the Related Art

In recent years, various types of ceramic superconductors chemical $Cu_3O_{7-y}$, $Bi_2Sr_2Ca_{n-1}Cu_nO_x$, $Tl_mBa_2Ca_{n-1}Cu_nO_x$ (m=1, 2; n=1, 2, 3, 4, 5, . . .), and $(Nd_{1-x}Ce_x)_2CuO_{4-y}$ have been developed. Critical temperatures (Tc) of these ceramic superconductors reach 125 K.

Since these ceramic superconductors have poor workability, they are used in a state wherein a high-conductivity metal layer 2 is formed to cover a ceramic superconductor layer 1, as shown in FIG. 11. The form of such a ceramic superconductor is obtained by filling a ceramic superconductor or its precursor powder in a metal pipe or the like, rolling the pipe, and performing a predetermined heat treatment of the rolled pipe.

The high-conductivity metal layer consisting of a ceramic superconductor serves as a heat sink against heating caused by a flux jump as a rapid shift of a magnetic flux in the ceramic superconductor layer during energization. The high-conductivity metal layer also serves as a current bypath. A high-conductivity metal such as Ag or Cu having high thermal and electric conductivities is used as the above high-conductivity metal layer. In addition to these functions, a high-conductivity metal layer such as an Ag or Cu layer protects ceramic superconductors from external harmful substances and mechanically reinforces the ceramic superconductor.

A conventional ceramic superconductor wire covered with a high-conductivity metal layer such as an Ag or Cu layer causes the metal layer to generate an eddy current upon AC current energization of the ceramic superconductor wire.

The following problem is also posed when the above superconductor is used for a current lead. An SMES power generator, an MHD power generator, a fusion reactor, a linear motor car, a medical MRI, an accelerator magnet, and the like have been developed as low-temperature equipment using superconductor magnets. A current is supplied from an external power source to such low-temperature equipment through a current lead wire. The current lead wire consists of a metal material such as Cu, Cu-Ag, or Cu-P. Metal conductors are subjected to Joule heating upon current energization and absorption of a large amount of external heat. A large amount of coolant is undesirably evaporated.

There has been proposed use of a metal or intermetallic superconductor such as Nb-Ti and Nb$_3$Sn as the above current lead wire which does not produce Joule heat by cooling the metal or intermetallic superconductor to a liquid He temperature (4.2 K) to nullify an electric resistance. Such a superconductor cannot be used near any equipment except for low-temperature equipment cooled to the liquid He temperature and cannot sufficiently enhance its effect.

In most recent years, ceramic superconductors such as $YBa_2Cu_3O_7$, $Bi_2Sr_2CaCu_2O_8$, $Bi_2Sr_2Ca_2Cu_3O_{10}$, $Tl_2Ba_2CaCu_2O_8$, $Tl_2Ba_2Ca_2Cu_3O_{10}$ having critical temperatures (Tc) as high as 8 to 125 K, which allow substances to be superconductive at the liquid $N_2$ temperature, have been found.

These ceramic superconductors have high critical temperatures (Tc). When these superconductors are used as current lead wires, a liquid He cooling effect from the low-temperature equipment can be sufficiently utilized. Ceramic superconductors have low heat conductivities unlike metal materials such as Cu, and have an advantage in low absorption of external heat. Therefore, these ceramic superconductors have been expected as practical current lead wires.

Since a ceramic superconductor is, however, brittle, the following process is required. For example, a ceramic superconductor powder is filled in a metal tube as of Ag or Au, and the metal tube is then extruded, pressed, rolled, drawn or swaged. In this case, the metal tube must have good workability and a high purity, and have a ratio of a wall thickness to a sectional area to be 30 to 50% or more because the ceramic superconductor is hard. For this reason, a large amount of heat is conducted to the low-temperature equipment from a metal layer of a current lead wire rolled from the metal tube. A large amount of liquid He as a coolant is consumed, thus resulting in poor economy.

SUMMARY OF THE INVENTION

It is an object of the present invention to provide a ceramic superconductor wire having a high critical current density (Jc), a small AC current loss, and excellent productivity, and a method of manufacturing the ceramic superconductor wire.

It is another object of the present invention to provide a ceramic superconductor wire having a high constant critical current density (Jc) and a low heat conductivity and capable of minimizing an evaporation amount of a coolant such as liquid He, and a method of manufacturing the ceramic superconductor wire.

The present invention is based on findings wherein part of a high-conductivity metal layer which covers a ceramic superconductor layer is converted into a low-conductivity portion, so that the AC current loss of the ceramic superconductor is greatly reduced. The present invention is also based on finding wherein a part of a high-conductivity metal layer which covers a ceramic superconductor layer is converted into a low-thermal conductivity portion, so that the evaporation amount of a coolant is greatly reduced. Extensive studies have also be made to reach the present invention.

According to the present invention, there is provided a ceramic superconductor comprising a ceramic superconductive member and a high-conductivity metal layer covering the ceramic superconductive member, at least a portion of the metal layer having low electrical conductivity or low thermal conductivity.

In the superconductor wire of the present invention, a low-conductivity portion is formed in the metal layer covered on the ceramic superconductor wire, and an eddy current loop generated by the metal layer during AC current energization is shielded by the low-conductivity portion, thereby reducing the AC current loss. Furthermore, in the present invention, a low thermal conductivity portion is formed in the metal layer covered on the ceramic superconductor wire, thereby reduced the evaporation amount of a coolant.

A metal such as Ag or Cu having high heat and electric conductivities is used to form the metal layer. An alloy obtained by solid-dissolving an element such as Pd, Ni, Zn, Cd, Sn, P, Si, or Be in the metal such as Ag or Cu is used to form the low-conductivity portion, which is formed in the metal layer. Same as the alloy obtained from Zn, In, Cd, Ar, Mg, Be, Ni, Fe, Co, Cr, Ti, Mn, Zr, Al, Ga, RE (rare metal element) in the metal such as Ag or Cu is used to form the low thermal conductivity portion.

The present invention will be described with reference to FIGS. 1 to 5.

Referring to FIG. 1, the left half of a high-conductivity metal layer 2 which covers a ceramic superconductor layer 1 having a circular section is formed into a low-conductivity portion 3.

FIG. 2 shows a conductor tape. The lower half of a high-conductivity metal layer 2 is formed into a low-conductivity portion 3. This tape is suitable as an AC feeder cable conductor in a rotary structure. The tape is helically wound through an insulating film on a former (Al pipe) so that low-conductivity surfaces face each other. In this case, the former constitutes a 3-phase AC superconductor shown in FIG. 6. Reference numeral 21 in FIG. 6 denotes an Al pipe; 22, a superconductor tape; 23, semi-synthetic paper insulation; 24, a thermal insulation layer; and 25, a stainless steel pipe.

In a wire shown in FIG. 3, both ends of the conductor tape shown in FIG. 2 are slit, and the slit portions are covered with resin layers 4. When this wire is wound around a core pipe serving as a coolant flow path, coupling losses produced between the wires can be appropriately minimized.

In a wire shown in FIG. 4, an outer half of a high-conductivity metal layer 2 of a ceramic superconductor layer 1 having a circular section is formed as a low-conductivity portion 3.

In a cable shown in FIG. 5, an entire metal layer of a ceramic superconductor layer 1 having a circular section is formed as a low-conductivity portion 3, and a plurality of the resultant wires are covered with a high-conductivity metal layer 2. The resultant cable is suitable as an AC magnet cable.

In the ceramic superconductor wires and cable shown in FIGS. 1 to 5, each low-conductivity portion can be narrow. A better effect can be obtained when a plurality of narrow low-conductivity portions are formed at predetermined intervals so as to shield an eddy current loop.

According to the present invention, there is also provided a method of manufacturing a ceramic superconductor wire, comprising the steps of:

filling a ceramic superconductor or a precursor thereof in a high-conductivity metal pipe thereby forming a composite member;

rolling the composite member into a ceramic superconductor element of a desired shape, which comprises a ceramic superconductive member and a high-conductivity metal layer covering the ceramic superconductive member;

performing a predetermined heat treatment on the ceramic superconductor element; and alloying a predetermined portion of the high-conductivity metal layer, thereby rendering said portion less conductive either electrically or thermally.

The following various ceramic superconductors may be used as a ceramic superconductor used in this method, such as $YBa_2Cu_3O_7$, $Bi_2Sr_2CaCu_2O_8$, $Bi_2Sr_2Ca_2Cu_3O_{10}$, $Tl_2Ba_2CaCu_2O_8$, $Tl_2Ba_2Ca_2Cu_3O_{10}$.

The precursor of the ceramic superconductor can be an intermediate produced in the process for synthesizing a ceramic superconductor from a starting material for a ceramic superconductor and can be exemplified as a mixture of oxides containing elements constituting a ceramic superconductor, a co-precipitated mixture, an oxygen-deficient compound oxide, or an alloy constituted by the above alloy elements. Such a precursor is reacted with a ceramic superconductor during heating in an oxygen atmosphere.

When the ceramic superconductor is an oxygen-deficient n-type oxide superconductor, a material of the high-conductivity metal pipe can be Cu which can be easily oxidized in a reduction atmosphere. However, when the ceramic superconductor consists of a p-type oxide superconductor such as an oxide superconductor represented by chemical formula $YBa_2Cu_3O_{7-\delta}$ ($\delta$ is advantageously reduced to almost zero), heating is performed in the oxygen atmosphere. A material of the metal pipe is preferably Ag which cannot be easily oxidized and has a high $O_2$ permeability. Another metal such as Au, Pd, Pt, Ir, Rh is preferable in consideration of non-reactivity with a superconductor and mechanical workability.

A method of forming a low-conductivity portion in a high-conductivity metal layer may be: a method of precipitating an element for reducing an electric conductivity at a predetermined portion of the surface of the high-conductivity metal layer in accordance with plating, PVD (Physical Vapor Deposition), or CVD (Chemical Vapor Deposition), thermally diffusing the precipitated element, and alloying the precipitated element with the high-conductivity metal layer to form a low-conductivity portion; ion implantation; or a method obtained by combining ion implantation and thermal diffusion.

According to the method of the present invention, assume that the ceramic superconductor is a p-type oxide superconductor and alloying is performed in the high-conductivity metal layer to form a low-conductivity portion prior to heating of a rolled pipe. In this case, when an alloy element is a base element, the alloy element is oxidized to restore the electrical conductivity of the low-conductivity portion. Therefore, mixing of the alloy element is preferably performed after heating.

A method of forming a low-thermal conductivity portion can be performed as follows. A film is formed on a metal layer by metal plating with a suitable metal, PVD, CVD, paste coating, soldering, cladding, or the like and is heated to diffuse the suitable metal in the metal layer to alloy the suitable metal with a metal constituting the metal layer. Examples of suitable metals are Zn, In, Cd, Cu, Mg, Be, Ni, Fe, Co, Cr, Ti, Mn, Zr, Al, Ga, and RE (rare-earth element). Such a metal is suitable because it can greatly reduce the heat conductivity of the metal layer in a small amount.

Another useful alloying method is ion implantation or a method of holding a ceramic superconductor wire in a metal vapor to partially alloy the wire with the metal vapor. A terminal connected to low-temperature equipment or an external power source is desirably kept to have a low electric resistance without requiring alloying so as to suppress Joule heating.

This method will be described with reference to FIGS. 7 to 10.

FIGS. 7 and 8 are perspective views of ceramic superconductor wires obtained by covering the surfaces of ceramic superconductors with metal layers, respectively.

More specifically, the ceramic superconductor wire shown in FIG. 7 is obtained by covering a rod-like ceramic superconductor powder-molded body 11 with a metal layer 12. The ceramic superconductor wire shown in FIG. 8 is obtained by covering noble metal layers 12 on the upper and lower surfaces of a plate-like ceramic superconductor powder-molded body 11. End portions of the ceramic superconductor powder-molded body 1 are exposed outside.

A ceramic superconductor wire is heated and sintered at a predetermined temperature to partially alloy the metal layer 12 so as to form portions 13 except for connecting portions 14 of the ceramic superconductor, as shown in FIG. 9.

As shown in FIG. 10, an improved current lead wire is obtained such that noble metal layers 12 of the portions 13 of the ceramic superconductor wire except for the connecting portions 14 are made thin. The thin noble metal layers 12 can further reduce an amount of absorption heat. In this case, the thin noble metal layers 12 are formed, and then connecting portions are formed at terminals of the wire. Alloying can be performed before or after the thin noble metal layers 12 are formed. A method of forming thin noble metal layers may be any method such as chemical etching or mechanical milling.

A single-core superconductor wire has been exemplified. The method of the present invention is, however, equally applicable to a multi-core superconductor cable having a plurality of superconductor wires.

The ceramic superconductor wire according to the present invention has the low-conductivity portion partially formed in the high-conductivity metal layer as the outermost layer of the ceramic superconductor wire. Generation of an eddy current during AC current energization can be suppressed, and the AC current loss can be greatly reduced. Since the low-conductivity metal portion may be formed in part of the high-conductivity metal layer, the main function of the high-conductivity metal layer as a heat sink against a flux jump cannot be impaired. In addition, the function of protecting the ceramic superconductor layer against the outer atmosphere is not lost from the metal layer. Moreover, since the low-conductivity portion is formed by alloying, mechanical properties of the metal layer can be improved.

Positive conductivity correlation between heat and electricity is apparently established in metals without citing the Wiedemann-Franz law. Wire materials of the present invention are suitable as current lead wires.

According to the present invention, in a high-Tc ceramic superconductor whose at least part of the surface is covered with a high-conductivity layer a of a noble metal, the noble metal layer is alloyed to form a current lead wire. In use of the resultant current lead wire, Joule heating of the ceramic superconductor wire can be suppressed by a cooling effect of the low-temperature equipment, and conduction of external heat to the low-temperature equipment due to a decrease in heat conductivity of the ceramic superconductor wire can be suppressed.

Alloying of the noble metal layer is performed after predetermined rolling of the ceramic superconductor wire finishes. Therefore, rolling workability of the ceramic superconductor wire is not impaired. The noble metal layer is made thin before or after the noble metal is alloyed, thereby further suppressing heat conduction from the current lead wire.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a view showing a ceramic superconductor wire using a ceramic superconductor layer having a circular section according to the present invention;

FIG. 2 is a view for explaining a ceramic superconductor wire employing a conductor tape according to the present invention;

FIG. 3 is a view for explaining a ceramic superconductor wire having conductive tapes respectively formed at both ends of the wire according to the present invention;

FIG. 4 is a view for explaining a ceramic superconductor wire having a high-conductivity metal layer whose outer half is formed into a low-conductivity portion according to the present invention;

FIG. 5 is a view for explaining a ceramic superconductor wire having a metal layer which is entirely formed as a low-conductivity portion according to the present invention;

DETAILED DESCRIPTION OF THE PREFERRED EMBODIMENTS

Figure 6:
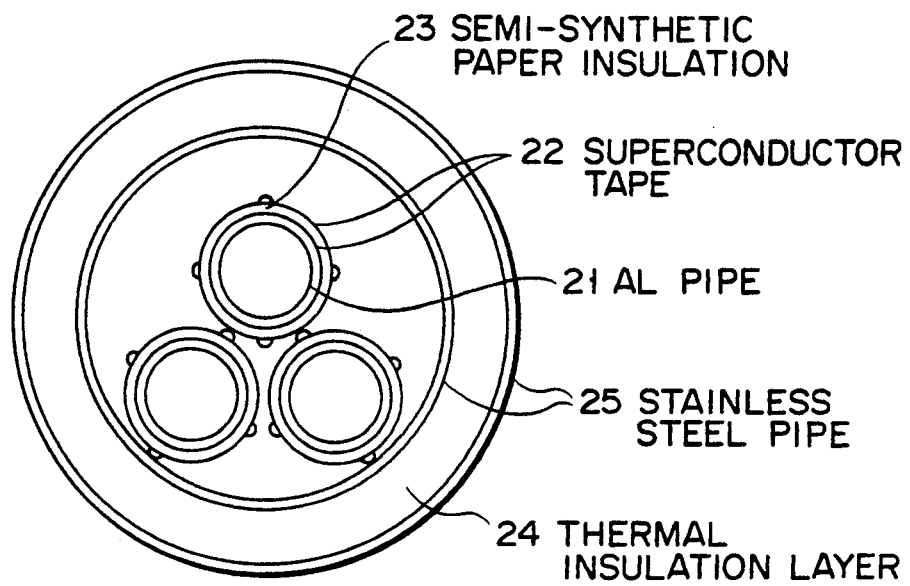
FIG. 6 is a view for explaining a 3-phase AC superconductor cable employing a ceramic superconductor wire.
Figure 7:
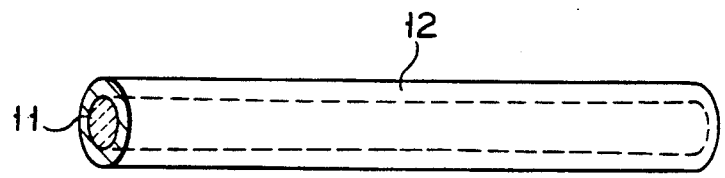
FIGS. 7 and 8 are perspective views of a ceramic superconductor wire obtained by covering a ceramic superconductor wire with a metal layer according to the present invention.
Figure 8:
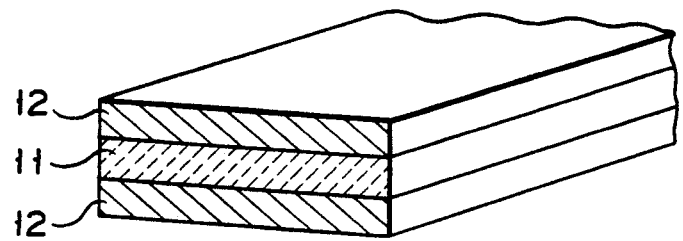
Figure 9:
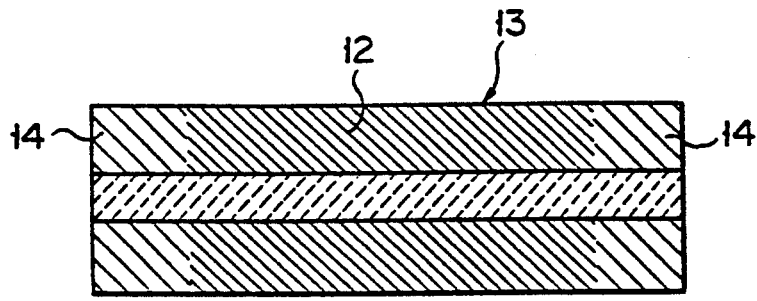
FIG. 9 is a view for explaining an alloyed ceramic superconductor wire according to the present invention.
Figure 10:
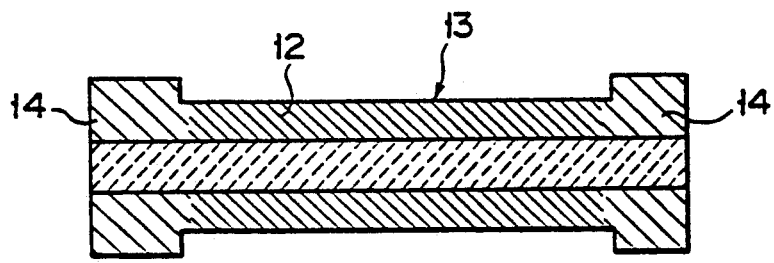
FIG. 10 is a view for explaining a ceramic superconductor wire whose thin metal layer is alloyed according to the present invention.
Figure 11:
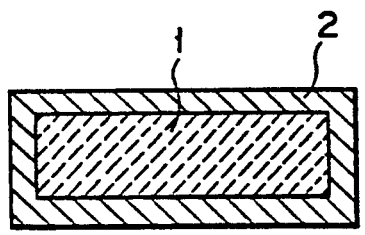
FIG. 11 is a view showing a sectional structure of a conventional wire.

The present invention will be described in detail by way of its examples.

EXAMPLE 1

$Y_2O_3$, $BaCO_3$, and $CuO$ were blended and mixed at an atomic ratio of 1:2:3 (Y:Ba:Cu), and a powder mixture was calcined in air at 880° C. for 24 Hr. The calcined body was pulverized and classified to obtain a calcined powder. The calcined powder was molded by CIP molding to form a 9-mm diameter rod. The rod was preliminarily sintered in an oxygen flow at 850° C. for 8 Hr and was filled in an Ag pipe having an outer diameter of 12 mm and an inner diameter of 9 mm. The Ag pipe filled with the CIP-molded body was swaged and rolled by a grooved roll to obtain a 2.5-mm wire. This wire was formed into a 0.3-mm thick tape by a roll. The tape element was heated in an oxygen flow at 900° C. for 8 Hr and was then cooled from 900° C. at a rate of 2° C./min. Zn was electrically plated on one surface of the tape element to a thickness of 4.5 μm, and the resultant structure was heated in an Ar flow at 450° C. for 10 Hr. This tape was slitted to have a width of 3 mm, and a Teflon tape was wound around each wire to obtain a ceramic superconductor wire.

EXAMPLE 2

$Bi_2O_3$, SrO, CaO, and CuO were blended and mixed at an atomic ratio of 2:1.9:2.1:2.5 (Bi:Sr:Ca:Cu), and a power mixture was calcined in an oxygen flow at 650° C. The calcined body was pulverized and classified to obtain a calcined powder. Following the same procedures as in Example 1, the calcined powder was subjected to CIP molding, sealing in an Ag pipe, and rolling to form a 0.3-mm thick tape element.

The Ag layer on one surface of the tape element was etched with $HNO_3$ by a depth of 30 μm, Pd was plated on the etched surface by a thickness of 10 μm. The resultant structure was held in an $N_2+7.5\%O_2$ flow at 890° C. for 30 minutes and was cooled from 890° C. at a rate of 2.5° C./min. Both ends of the resultant structure were slitted to have a width of 3 mm, and a Teflon table was wound around each wire for electric insulation, thereby obtaining a ceramic superconductor wire.

EXAMPLE 3

$Nd_2O_3$, $CeO_2$, and CuO were blended and mixed at an atomic ratio of 1.7:0.3:1 (Nd:Ce:Cu), and a powder mixture was calcined in an $O_2$ flow at 1,050° C. for 8 Hr. The calcined body was pulverized and classified to obtain a calcined powder. The calcined powder was CIP-molded to obtain a 9-mm diameter rod. The rod was filled in an Ni-plated Cu pipe having an outer diameter of 12 mm and an inner diameter of 9 mm after the rod was preliminarily sintered.

Following the same procedures as in Example 1, the Cu pipe filled with the preliminarily sintered rod body was rolled into a 0.3-mm thick tape element. Zn and Ni were sequentially plated on one surface of the tape element to thicknesses of 5 μm and 10 μm, respectively. The resultant structure was heated in an Ar flow at 980° C. for 4 Hr and was removed from a heating furnace and cooled. Both ends of the sintered body were slitted into a tape body having a width of 3 mm. A Teflon tape was wound around each wire, thereby obtaining a ceramic superconductor wire.

Critical current densities (Jc) and conductivities of the metal layers of the ceramic superconductor wires prepared in Examples 1 to 3 were measured. Test results are shown in Table 1 below.

As is apparent from Table 1, the samples in Examples 1 to 3 had high critical current densities (Jc). The conductivities of the low-conductivity portions partially formed in the high-conductivity metal layers which cover the ceramic superconductors were as low as 1 to 4%. The eddy currents generated in the metal layers during AC current energization can be greatly suppressed. For this reason, the AC current loss can be reduced to about 10% of the conventional wire whose metal layer is a rigid conductive metal layer.

The samples in Examples 1 to 3 exemplified wires having the structure shown in FIG. 2 or 3. The entire metal layers of the wires may be alloyed, and a plurality of wires are bundled, soldered, and fixed within an Ag or Cu pipe to obtain a cable shown in FIG. 5. This also provides the same effect as in Examples 1 to 3.

TABLE 1

| Classification | | No. | Type of Superconductor | Metal Layer | | $J_c^*$ A/cm$^2$ | Conduc-** tivity Ratio |
|---|---|---|---|---|---|---|---|
| | | | | High-Conductivity Metal Layer | Low-Conductivity Portion | | |
| Sample of Present Invention | Example 1 | 1 | Y | Ag | Zn mixing | $0.8 \times 10^4$ | 2.1 |
| | Example 2 | 2 | Bi | Ag | Pd mixing | $5.1 \times 10^4$ | 3.5 |
| | Example 3 | 3 | Nd | Cr-plated Cu | Zn, Ni mixing | $1.2 \times 10^4$ | 1.3 |

*Measured in a magnetic field of 500 gauss at 40 K for sample Nos. 1 and 2. Measured in a magnetic field of 500 gauss at 4.2 K for sample No. 3.
**The ratio of conductivity of low-conductivity portion to that of high-conductivity metal layer

EXAMPLE 4

$Bi_2O_3$, SrO, CaO, CuO powders were blended and mixed at an atomic ratio of 2:2:1:2 (Bi:Sr:Ca:Cu) and this powder mixture was calcined in air at 800° C. for 30 Hr. The calcined body was pulverized and classified to obtain a $Bi_2Sr_2CaCu_2O_x$ calcined powder. This calcined powder was filled in an Ag tube having an outer diameter of 26 mm and an inner diameter of 18 mm. The tube with the calcined powder is rolled by a grooved roll to obtain a 4-mm diameter wire. This wire was rolled by flat rolling to obtain a tape having a thickness of 0.3 mm and a width of 7 mm.

The tape was sintered in an $O_2$ flow at 860° C. for 30 Hr to obtain an oxide superconductor wire covered with an Ag layer. The Ag layer of the oxide superconductor wire was plated with Zn to form a 3-μm thick Zn layer. The resultant structure was heated in an Ar flow at 450° C. for 2 Hr to prepare a current lead wire.

EXAMPLE 5

A current lead wire was manufactured following the same procedures as in Example 4 except that the thickness of Zn plated on the Ag layer was 10 μm and heating was performed at 450° C. for 4 Hr.

EXAMPLE 6

A current lead wire was manufactured following the same procedures as in Example 4 except that Zn was plated on an Ag layer to a thickness of 3 μm, Cd was then plated to have a thickness of 5 μm, and heating was performed at 500° C. for 2 Hr.

EXAMPLES 7-9

Current lead wires were respectively manufactured following the same procedures as in Examples 4 to 6 except that surfaces of Ag layers of oxide superconductor wires covered with the Ag layers were etched by a diluted nitric acid by a depth of 15 μm each.

COMPARATIVE EXAMPLES 1 AND 2

Current lead wires were manufactured following the same procedures as in Example 4 or 7 except that Ag layers were not alloyed.

Jc values and heat conductivities of the current lead wires of Examples 4 to 9 and Comparative Examples 1 and 2 were measured at 4.2 K and 77 K. Test results are summarized together with main manufacturing conditions in Table 2 below.

As is apparent from Table 2, samples (No. 4 to 9) of the present invention had lower heat conductivities than those of samples (No. 10 and 11) of the comparative examples due to alloying of the metal layers on the surfaces of the ceramic superconductor wires.

In the current lead wires of sample Nos. 7 to 9, the Ag layers on the ceramic superconductor wires were etched and made thin, and thin Ag layers were alloyed. Therefore, the alloying density was increased to further reduce the heat conductivities. Therefore, external heat conduction could be greatly suppressed together with an effect of thin Ag layers.

The wires of sample Nos. 4 to 9 had lower critical current densities (Jc) than those of sample Nos. 10 and 11 of the comparative examples by amounts corresponding to the degrees of alloying of the Ag layers formed on the ceramic superconductor wires, but differences were very small.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

members each prepared by covering the ceramic superconductive member with the first metal layer, wherein electrical conductivity of the first metal layer is lower than that of the second metal layer, whereby an eddy current loop generated in the first and second metal layers by current flowing in the superconductor is reduced by the first and second metal layers.

2. The ceramic superconductor according to claim 1, wherein the first layer is made of an alloy containing at least one element selected from the group consisting of Pd, Ni, Zn, Cd, Sn, P, Si and Be.

3. The ceramic superconductor according to claim 2, wherein the ceramic superconductive member is made of a compound selected from the group consisting of $YBa_2Cu_3O_7$; $Bi_2Sr_2CaCu_2O_8$; $BiSr_2Ca_2Cu_3O_{10}$; $Tl_2Ba_2CaCu_2O_8$; and $Tl_2Ba_2Ca_2Cu_3O_{10}$.

4. The ceramic superconductor according to claim 2, wherein the ceramic superconductive member has a circular shape in cross section.

5. The ceramic superconductor according to claim 4, wherein the ceramic superconductive member is made of a compound selected from the group consisting of $YBa_2Cu_3O_7$; $Bi_2Sr_2CaCu_2O_8$; $BiSr_2Ca_2Cu_3O_{10}$; $Tl_2Ba_2CaCu_2O_8$; and $Tl_2Ba_2Ca_2Cu_3O_{10}$.

6. The ceramic superconductor according to claim 2, wherein the ceramic superconductor member is a tape having a rectangular cross section.

7. The ceramic superconductive according to claim 6, wherein the ceramic superconductive member is made of a compound selected from the group consisting of $YBa_2Cu_3O_7$; $Bi_2Sr_2CaCu_2O_8$; $BiSr_2Ca_2Cu_3O_{10}$; $Tl_2Ba_2CaCu_2O_8$; and $Tl_2Ba_2Ca_2Cu_3O_{10}$.

8. The ceramic superconductor according to claim 1, wherein the ceramic superconducting member has a circular shape in cross section.

9. The ceramic superconductor according to claim 1, wherein the ceramic superconductive member is tape having a rectangular cross section.

10. The ceramic superconductor according to claim 1, wherein the ceramic superconductive member is made of a compound selected from the group consisting of $YBa_2Cu_3O_7$; $Bi_2Sr_2CaCu_2O_8$; $BiSr_2Ca_2Cu_3O_{10}$; $Tl_2Ba_2CaCu_2O_8$; and $Tl_2Ba_2Ca_2Cu_3O_{10}$.

TABLE 2

| | | | Alloying | | 4.2 K | | 77 K | |
| | | | Plating | | | | | |
| Classi-fication | | No. | Surface Treatment of Ag Film | Thickness (μm) Zn + Cd | Heating Condition °C. × H | $J_c$ A/cm$^2$ | Heat* Conductivity | $J_c$ A/cm$^2$ | Heat* Conductivity |
| --- | --- | --- | --- | --- | --- | --- | --- | --- | --- |
| Sample by Method of Present Invention | Example 4 | 4 | No | 3 | 450 × 2 | 3.9 × 10$^5$ | 38 | 1.7 × 10$^4$ | 51 |
| | Example 5 | 5 | No | 10 | 450 × 4 | 3.7 × 10$^5$ | 30 | 1.4 × 10$^4$ | 47 |
| | Example 6 | 6 | No | 3 + 5 | 500 × 2 | 3.7 × 10$^5$ | 32 | 1.5 × 10$^4$ | 49 |
| | Example 7 | 7 | Yes | 3 | 450 × 2 | 3.6 × 10$^5$ | 30 | 1.5 × 10$^4$ | 42 |
| | | 8 | Yes | 10 | 450 × 4 | 3.5 × 10$^5$ | 27 | 1.2 × 10$^4$ | 37 |
| | | 9 | Yes | 3 + 5 | 500 × 2 | 3.4 × 10$^5$ | 28 | 1.4 × 10$^4$ | 37 |
| Sample by Comparative Method | Comparative Example 1 | 10 | No | — | — | 3.9 × 10$^5$ | 100 | 2.0 × 10$^4$ | 100 |
| | Comparative Example 2 | 11 | Yes | — | — | 3.8 × 10$^5$ | 78 | 1.9 × 10$^4$ | 79 |

*Relative values with respect to Comparative Examples (Nos. 10 and 11) as 100

What is claimed is:

1. A ceramic superconductor comprising:
a ceramic superconductive member; a first metal layer covering the ceramic superconducting member; and a second metal layer, made of noble metal selected from the group consisting of Ag, Au, Pd, Pt, Ir and Rh, covering a bundle of a plurality of

* * * * *